(12) United States Patent
Ookura

(10) Patent No.: US 10,444,066 B2
(45) Date of Patent: Oct. 15, 2019

(54) OPTICAL SENSOR

(71) Applicant: DENSO CORPORATION, Kariya, Aichi-pref. (JP)

(72) Inventor: Takamitsu Ookura, Kariya (JP)

(73) Assignee: DENSO CORPORATION, Kariya (JP)

( * ) Notice: Subject to any disclaimer, the term of this patent is extended or adjusted under 35 U.S.C. 154(b) by 157 days.

(21) Appl. No.: 15/547,108

(22) PCT Filed: Feb. 12, 2016

(86) PCT No.: PCT/JP2016/000718
§ 371 (c)(1),
(2) Date: Jul. 28, 2017

(87) PCT Pub. No.: WO2016/139897
PCT Pub. Date: Sep. 9, 2016

(65) Prior Publication Data
US 2018/0010960 A1  Jan. 11, 2018

(30) Foreign Application Priority Data

Mar. 3, 2015 (JP) .................................. 2015-41628

(51) Int. Cl.
| | |
|---|---|
| *G01J 1/06* | (2006.01) |
| *G01S 3/784* | (2006.01) |
| *G01J 1/42* | (2006.01) |
| *H01L 27/144* | (2006.01) |
| *H01L 31/02* | (2006.01) |

(Continued)

(52) U.S. Cl.
CPC .............. *G01J 1/06* (2013.01); *G01J 1/4228* (2013.01); *G01S 3/784* (2013.01); *H01L 27/1446* (2013.01); *H01L 27/14623* (2013.01); *H01L 31/02019* (2013.01); *H01L 31/02164* (2013.01); *H01L 31/02327* (2013.01); *B60J 1/02* (2013.01);

(Continued)

(58) Field of Classification Search
CPC ........... G01S 3/784; G01S 3/7835; G01J 1/06
See application file for complete search history.

(56) References Cited

U.S. PATENT DOCUMENTS

| | | | |
|---|---|---|---|
| 6,521,882 B1 | 2/2003 | Sumiya et al. | |
| 2009/0295640 A1* | 12/2009 | Shimizu | G01S 3/043 342/417 |

(Continued)

FOREIGN PATENT DOCUMENTS

JP     2005-249478 A     9/2005

*Primary Examiner* — Thanh Luu
(74) *Attorney, Agent, or Firm* — Posz Law Group, PLC

(57) ABSTRACT

An optical sensor includes a substrate having a plurality of first light receiving elements in a surface, and a light blocking film having a plurality of first openings. The first light receiving elements are provided such that a direction of travel of incident light defined by each of the first openings is different from a thickness direction of the substrate and form at least one light receiving element set in which an angle of incidence defined between the direction of travel of the incident light and the thickness direction is the same with respect to the light receiving elements. In a view projected in the thickness direction, a positional relationship between the first light receiving elements included in a light receiving element set and the corresponding first openings has rotational symmetry of order 3 or more about an axis along the thickness direction.

7 Claims, 6 Drawing Sheets

(51) Int. Cl.
*H01L 31/0216* (2014.01)
*H01L 31/0232* (2014.01)
*H01L 27/146* (2006.01)
*B60J 1/02* (2006.01)
*B60R 11/00* (2006.01)

(52) U.S. Cl.
CPC ....... *B60R 11/00* (2013.01); *B60R 2011/0026* (2013.01)

(56) References Cited

U.S. PATENT DOCUMENTS

| | | |
|---|---|---|
| 2010/0238430 A1 | 9/2010 | Meijer et al. |
| 2013/0037700 A1 | 2/2013 | Michiyama et al. |
| 2015/0221786 A1 | 8/2015 | Michiyama |

* cited by examiner

OPTICAL SENSOR

CROSS REFERENCE TO RELATED APPLICATION

This application is a U.S. national stage application of International Patent Application No. PCT/JP2016/000718 filed on Feb. 12, 2016 and is based on Japanese Patent Application No. 2015-41628 filed on Mar. 3, 2015, the disclosure of which is incorporated herein by reference.

TECHNICAL FIELD

The present disclosure relates to an optical sensor including a substrate having a plurality of light receiving elements in a surface thereof and a light blocking film disposed over the surface of the substrate to define the direction of travel of incident light relative to each of the light receiving elements.

BACKGROUND ART

As disclosed in Patent Literature 1, an optical sensor is known which includes a semiconductor substrate having a plurality of light receiving elements formed therein and a light blocking film defining the direction of travel of incident light relative to each of the light receiving elements. The plurality of light receiving elements are disposed to be arranged in a semi-circular configuration around a predetermined center reference point on a surface of the semiconductor substrate. The light blocking film has openings corresponding to the individual light receiving elements.

PATENT LITERATURE

Patent Literature 1: JP 2012-103126 A

SUMMARY

The optical sensor described above is mounted on a mounting target member such as a front windshield such that the rotation angle of the optical sensor about the thickness direction of the semiconductor substrate is a predetermined angle. The rotation angle of the optical sensor about the thickness direction of the semiconductor substrate is hereinafter referred to as a mounting angle. In this mounting structure, the direction of travel of incident light relative to the optical sensor varies depending on the mounting angle.

Accordingly, it is necessary to design the optical sensor such that a predetermined positional relationship is established between the light receiving elements and the openings in accordance with the mounting angle. In other words, in the optical sensor designed such that the predetermined positional relationship is established between the light receiving elements and the openings, the mounting angle is fixed to a predetermined angle.

An object of the present disclosure is to provide an optical sensor which can be improved in placement flexibility.

According to an aspect of the present disclosure, an optical sensor includes: a substrate having a plurality of first light receiving elements, each of which outputs a detection signal in accordance with an intensity of incident light, in a surface thereof; and a light blocking film disposed adjacent to the surface of the substrate and having a plurality of first openings corresponding to the first light receiving elements to define a direction of travel of the incident light relative to each of the first light receiving elements. The first light receiving elements are provided such that the direction of travel of the incident light is different from a thickness direction of the substrate and form at least one light receiving element set in which an angle of incidence defined between the direction of travel of the incident light and the thickness direction is the same with respect to the light receiving elements. In a view projected in the thickness direction, a positional relationship between the first light receiving elements included in a same light receiving element set and the corresponding first openings has rotational symmetry of order 3 or more about an axis along the thickness direction.

When the optical sensor is mounted on a mounting target member such as a front windshield, the rotation angle of the optical sensor about the thickness direction of the substrate is hereinafter shown as a mounting angle. In the above-described configuration, there are three or more mounting angles at which the first light receiving elements and the first openings have the same positional relationship therebetween when the optical sensor is rotated about the axis along the thickness direction. In other words, there are three or more mounting angles at which detection characteristics are similar to each other when the optical sensor is rotated about the axis along the thickness direction. Accordingly, it is possible to improve the placement flexibility of the optical sensor without fixing the mounting angle to one angle.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
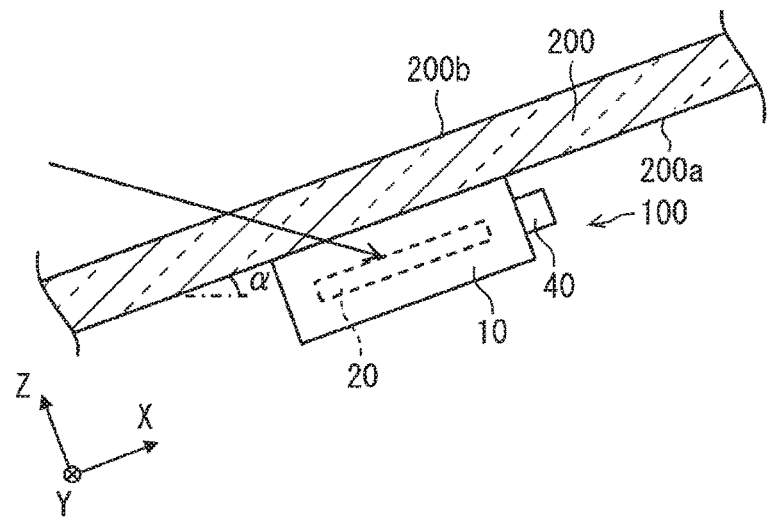
FIG. 1 is a side view showing a schematic configuration of an optical sensor according to a first embodiment.

The following will describe the embodiments of the present disclosure with reference to drawings. Note that, in each of the embodiments shown below, common or related elements shall be given the same reference numerals. The thickness direction of a substrate is shown as a Z-direction. A specific direction orthogonal to the Z-direction is shown as an X-direction. A direction orthogonal to the X- and Z-directions is shown as a Y-direction. A plane defined by the X- and Y-directions is shown as an XY-plane. A shape along the XY-plane is shown as a planar shape.

First Embodiment

Figure 2:
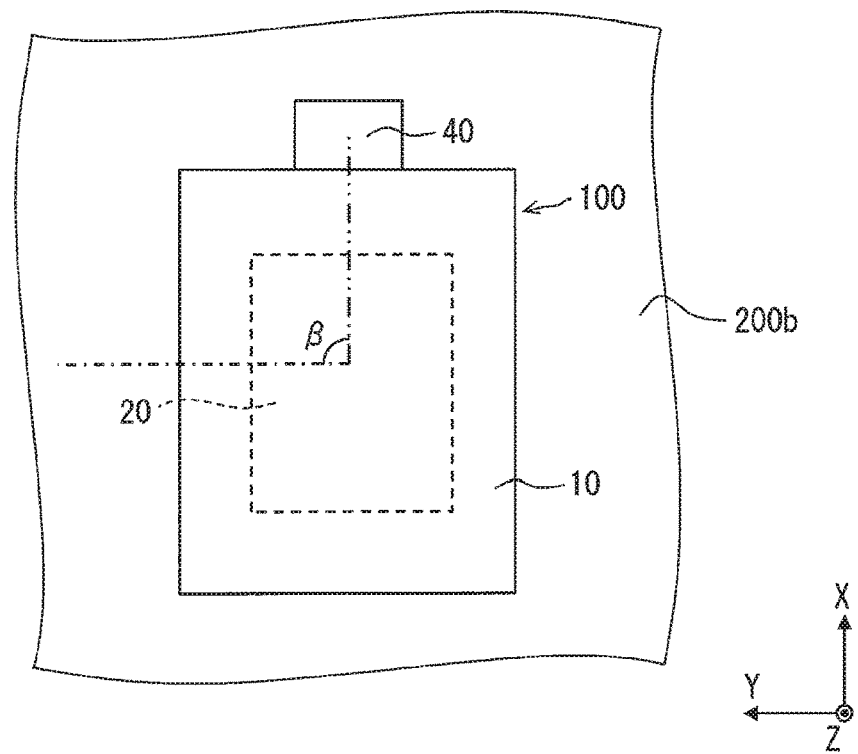
FIG. 2 is a plan view showing the schematic configuration of the optical sensor.

First, a description will be given of a schematic configuration of an optical sensor 100 on the basis of FIGS. 1 and 2.

The optical sensor 100 is a device which detects incident light. The optical sensor 100 outputs a detection signal in accordance with the intensity of the incident light and the direction of travel of the incident light.

In the present embodiment, the optical sensor 100 is a sensor to be mounted on a vehicle. The optical sensor 100 outputs the detection signal to an external device mounted on the vehicle. The detection signal from the optical sensor 100 is a signal for controlling the state of the vehicle.

As the optical sensor 100, a light sensor which controls the ON/OFF states of a headlight can be used. As the optical sensor 100, e.g., a solar radiation sensor which outputs a detection signal for controlling an air conditioner can also be used. In an example in which the optical sensor 100 is provided as a solar radiation sensor, the optical sensor outputs a detection signal to an air-conditioning ECU, and the air-conditioning ECU controls the air conditioner on the basis of the detection signal. As the optical sensor 100, e.g., a sensor which outputs a detection signal for adjusting the brightness of a HUD can also be used. The optical sensor 100 which outputs the detection signal for adjusting the brightness of the HUD is hereinafter shown as a HUD sensor.

It is also be possible to use an example in which the optical sensor 100 has plural ones of the respective functions of a solar radiation sensor, a light sensor, and a HUD sensor. The optical sensor 100 outputs a detection signal in accordance with the angle of incidence of incident light.

It is also possible to use an example in which the optical sensor 100 has a detection unit which detects a raindrop in addition to the detection unit 20 which detects incident light. In this example, the optical sensor 100 detects incident light and also detects the raindrop clinging to a back surface 200b of a front windshield 200.

The optical sensor 100 is mounted on the front windshield 200 of the vehicle. The front windshield 200 has a top surface (first surface) 200a and a back surface (second surface) 200b opposite to the top surface 200a. The top surface 200a is a surface inwardly facing the vehicle interior, while the back surface 200b is a surface outwardly facing the outside of the vehicle. The optical sensor 100 is mounted on the top surface 200a.

The top surface 200a and the back surface 200b are curved surfaces. However, the portion of the top surface 200a on which the optical sensor 100 is mounted can be regarded as a plane along the XY-plane. The portion of the top surface 200a on which the optical sensor 100 is mounted is hereinafter referred to as the top surface 200a. Note that the Y-direction is assumed to be a direction along the road surface where the vehicle is located. In a view projected in the Y-direction, the angle formed by the top surface 200a with respect to the road surface where the vehicle is located is referred to as a windshield angle α. Incident light is incident on the optical sensor through the front windshield 200. The optical sensor 100 includes a case 10, the detection unit 20, and a connector 40.

The case 10 is a member forming the outer shape of the optical sensor 100 and containing the detection unit 20. The case 10 is fixed to the top surface 200a via a bracket not shown. The case 10 is formed using, e.g., a resin material.

The detection unit 20 detects incident light in the optical sensor 100. On the detection unit 20, incident light is incident through the front windshield 200. The detection unit 20 outputs a detection signal in accordance with the intensity of the incident light and the direction of travel of the incident light. A detailed structure of the detection unit 20 will be described below.

The connector 40 electrically couples the detection unit 20 to an external device such as an ECU. The connector 40 is integrally molded with the case 10 or attached to the case 10. The connector 40 is electrically connected to the detection unit 20. The connector 40 fits into the connector of the external device. This allows the detection signal from the detection unit 20 to be output to the external device. The connector 40 is formed on the side of the case 10 in the X-direction where the connector 40 is closer to the upper end of the front windshield 200.

The optical sensor 100 is mounted such that the rotation angle of the optical sensor 100 about the Z-direction is a predetermined angle with respect to a predetermined reference line. The rotation angle of the optical sensor 100 about the Z-direction with respect to the reference line is hereinafter referred to as a mounting angle β. It is assumed that the mounting angle β is the angle formed clockwise by the line connecting the respective centers of the case 10 and the connector 40 with respect to the reference line about the Z-direction in a view projected from outside the vehicle.

The reference line is a line extending from the center of the case 10 in one direction along the Y-direction in a view projected in the Z-direction. In the present embodiment, the mounting angle β is assumed to be 90 degrees. Note that the range of the mounting angle β is assumed to be not less than 0 degrees and less than 360 degrees. In FIG. 2, the reference line is shown by the one-dot dash line, while the line connecting the center of the case 10 and the connector 40 is shown by the two-dot dash line.

Next, on the basis of FIGS. 3 and 4, a description will be given of the detailed structure of the detection unit 20. Note that, in FIG. 3, the first light receiving elements 28 are hatched to clearly show the planar shapes thereof.

Figure 3:
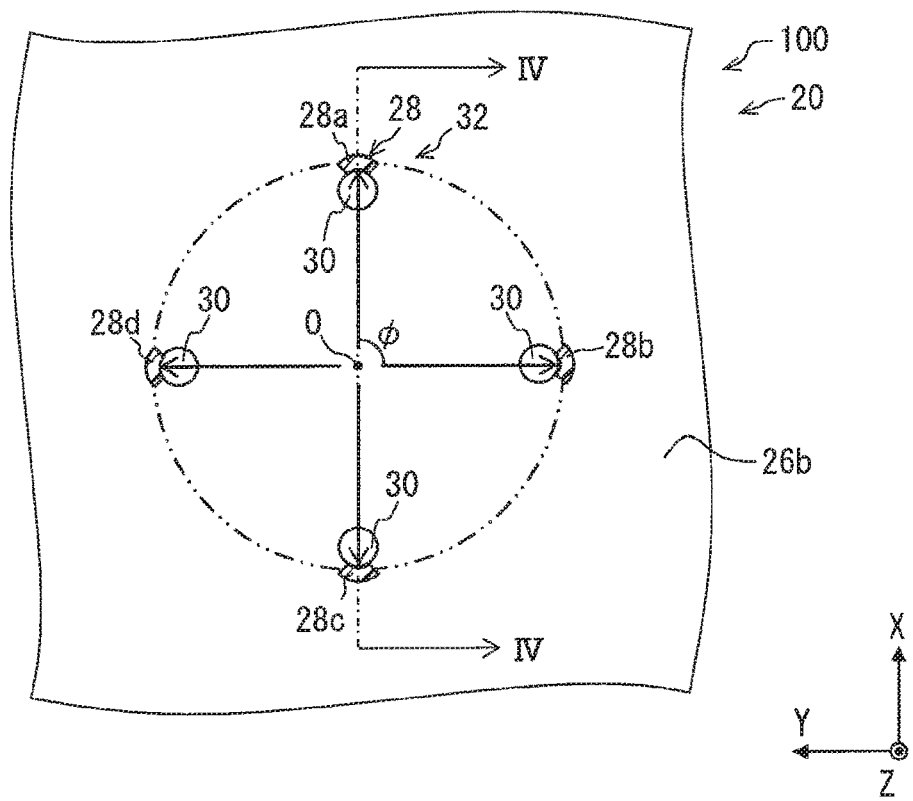
FIG. 3 is a plan view showing a detailed structure of a detection unit.
Figure 4:
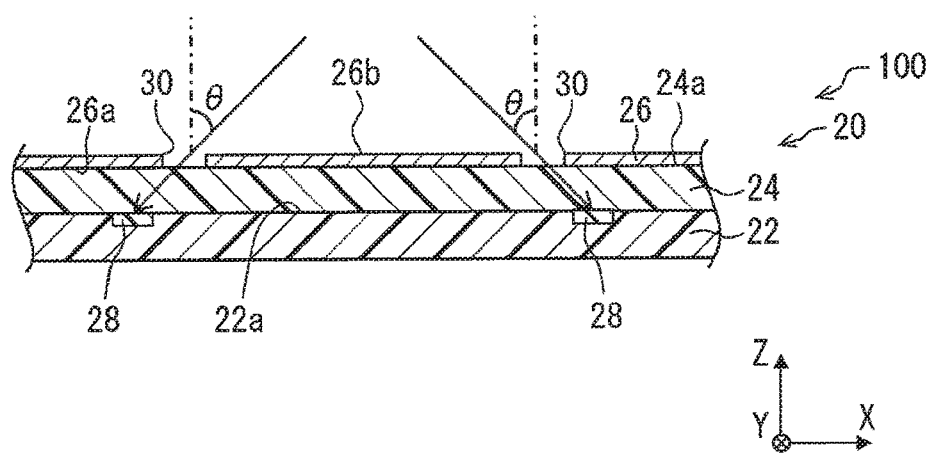
FIG. 4 is a cross-sectional view along a line IV-IV in FIG. 3.

As shown in FIGS. 3 and 4, the detection unit 20 has a substrate 22, a light transmission film 24, and a light blocking film 26. On a surface 22a of the substrate 22 which is closer to the front windshield 200, incident light is incident. In the present embodiment, the substrate 22 is provided as a semiconductor substrate. Adjacent to the surface 22a of the substrate 22, the plurality of first light receiving elements 28 are formed. Each of the first light receiving elements 28 outputs a detection signal in accordance with the intensity of the incident light.

In the present embodiment, each of the first light receiving elements 28 is provided as a photodiode. The first light receiving element 28 is made of a diffusion layer formed in the substrate 22 by ion implantation. Also, in the present embodiment, the four first light receiving elements 28 are formed in the substrate 22. Specifically, adjacent to the surface 22a of the substrate 22, first, second, third, and fourth photodiodes 28a, 28b, 28c, and 28d are formed as the first light receiving elements 28.

The detection unit 20 has an amplification unit and a processing unit which are not shown. The amplification unit amplifies the detection signal from each of the first light receiving elements 28. The processing unit adds up the detection signals amplified by the amplification unit. The signals added up by the processing unit are output as a detection signal from the optical sensor 100 to the external device. Over the surface 22a, the light transmission film 24 is formed.

The light transmission film 24 transmits the incident light. The light transmission film 24 is formed using an acrylic resin or silicon dioxide. The light transmission film 24 is disposed over the surface 22a. Over a back surface 24a of the light transmission film 24 which is opposite to the substrate 22, the light blocking film 26 is disposed.

The light blocking film 26 blocks the incident light and defines the direction of travel of the incident light relative to each of the first light receiving elements 28. The light blocking film 26 is formed using, e.g., aluminum. The light blocking film 26 has a surface 26a closer to the light transmission film 24 and a back surface 26b opposite to the surface 26a. In the light blocking film 26, first openings 30 through which the incident light passes are formed. The first openings 30 are through holes formed to extend from the surface 26a to the back surface 26b. The plurality of first openings 30 are formed to correspond to the individual first light receiving elements 28.

The incident light passes through the first openings 30 to be transmitted by the light transmission film 24 and incident on the first light receiving elements 28. In a view projected in the Z-direction, depending on the positional relationship between the first light receiving elements 28 and the first openings 30, the direction of travel of the incident light relative to each of the first light receiving elements 28 is determined. Specifically, to allow the incident light in a predetermined direction of travel to be incident on the center of each of the first light receiving elements 28, the relative positions of the respective centers of the first light receiving elements 28 and the first openings 30 are determined in the view projected in the Z-direction. In the present embodiment, the planar shape of each of the first openings 30 is in the form of an exact circle.

In the present embodiment, as the angle of incidence of the incident light, a first angle θ and a second angle φ are used. The first angle θ is the angle formed, with respect to an axis along the Z-direction, by the direction of travel of the incident light relative to each of the first light receiving elements 28. The first angle θ corresponds to the angle of incidence. The range of the first angle θ is assumed to be not less than 0 degrees and not more than 90 degrees. The second angle φ is formed clockwise by the direction of travel of the incident light relative to each of the first light receiving elements 28 with respect to a predetermined reference direction about the Z-direction in projected view from outside the vehicle interior. The reference direction is assumed to be one direction, along the X-direction, extending from the lower end of the front windshield 200 toward the upper end thereof. The range of the second angle φ is assumed to be not less than 0 degrees and less than 360 degrees.

The plurality of first light receiving elements 28 are formed such that the direction of travel of the incident light is different from the Z-direction. That is, the first light receiving elements 28 are formed to have a positional relationship with the corresponding first openings 30 such that the first angles θ are larger than 0 degrees.

The plurality of first light receiving elements 28 form at least one light receiving element set 32 in which the first angles θ with respect to the first light receiving elements 28 are the same. In other words, the light blocking film 26 is formed such that the first angles θ with respect to the plurality of first light receiving elements 28 are the same. In the present embodiment, all the first light receiving elements 28 are included in the one light receiving element set 32. In the view projected in the Z-direction, the first angle θ with respect to each of the first light receiving elements 28 is determined in accordance with the distance between the first light receiving element 28 and the corresponding first opening 30. Accordingly, the respective distances between the individual first light receiving elements 28 and the corresponding first openings 30 are set substantially equal.

In the view projected in the Z-direction, the positional relationship between the first light receiving elements 28 included in the same light receiving element set 32 and the corresponding first openings 30 has rotational symmetry of order 3 or more about the Z-direction. In other words, the light blocking film 26 is formed such that, in the view projected in the Z-direction, the direction of travel of the incident light relative to the first light receiving elements 28 with respect to which the first angles θ are the same has rotational symmetry of order 3 or more about the Z-direction. In the present embodiment, the positional relationship between the first light receiving elements 28 and the first openings 30 has rotational symmetry of order 4 about the Z-direction.

The second angle φ with respect to the first photodiode 28a is set to 0 degrees, while the second angle φ with respect to the second photodiode 28b is set to 90 degrees. The second angle φ with respect to the third photodiode 28c is set to 180 degree, while the second angle φ with respect to the fourth photodiode 28d is set to 270 degrees. In a configuration in which the first light receiving elements 28 and the first openings 30 have rotational symmetry, the values of the second angles φ with respect to the first light receiving elements 28 included in the same light receiving element set 32 are equidistant within the range of not less than 0 degrees and less than 360 degrees.

It is assumed that, in the view projected in the Z-direction, the direction of travel of the incident light relative to the first photodiode 28a extends in one of directions along the X-direction, while the direction of travel of the incident light relative to the third photodiode 28c extends in the other of the directions along the X-direction. It is also assumed that, in the view projected in the Z-direction, the direction of travel of the incident light relative to the second photodiode 28b extends in one of directions along the Y-direction, while the direction of travel of the incident light relative to the fourth photodiode 28d extends in the other of the directions along the Y-direction.

In the surface 22a, the plurality of first light receiving elements 28 are arranged in a circular pattern in the form of an exact circle. In FIG. 3, the circular pattern is shown by the two-dot dash line. The center of the circular pattern is hereinafter referred to as a center O. In the view projected in the Z-direction, the first openings 30 are formed on the lines connecting the center O and the individual first light receiving elements 28.

In the view projected in the Z-direction, the first light receiving elements 28 and the first openings 30 are formed such that the first light receiving elements 28 are further away from the center O than the corresponding first openings 30. In the view projected in the Z-direction, the positional relationship between the first light receiving elements 28 and the first openings 30 has rotational symmetry of order 4 about a direction passing through the center O and extending along the Z-direction.

As described above, each of the first openings 30 is formed such that incident light is incident at a predetermined angle of incidence with respect to the center of the corresponding first light receiving element 28. However, the incident light is also incident on the portion of each of the first light receiving elements 28 other than the center thereof. The range of the angle of incidence with respect to the first light receiving element 28 is determined in accordance with the planar shape and area of the first light receiving element 28.

The first light receiving elements 28 have planar shapes which are rotationally symmetric to each other about the Z-direction. In the present embodiment, the first light receiving elements 28 have planar shapes having rotational symmetry of order 4 about a direction passing through the center O and extending along the Z-direction.

The planar shapes of the individual first light receiving elements 28 are in the form of fans obtained by equally dividing a circle. The first light receiving elements 28 are formed to have the planar shapes having equal shortest distances to the respective centers of the corresponding first openings 30. Specifically, in the view projected in the Z-direction, the shortest distances between the individual portions of the inner circumferences of the fan shapes of the first light receiving elements 28 and the respective centers of the first openings 30 are set equal. In projected view in the Z-direction, the center angle of the fan shape of each of the first light receiving elements 28 is set to 90 degrees. Accordingly, the range of the second angle $\phi$ in which each of the first light receiving elements 28 can receive light is set to 90 degrees.

The range of the second angle $\phi$ in which the first photodiode 28a can receive light is set to be not less than 0 degrees and not more than 45 degrees and not less than 315 degrees and less than 360 degrees. The range of the second angle $\phi$ in which the second photodiode 28b can receive light is set to be not less than 45 degrees and not more than 135 degrees. The range of the second angle $\phi$ in which the third photodiode 28c can receive light is set to be not less than 135 degrees and not more than 225 degrees. The range of the second angle $\phi$ in which the fourth photodiode 28d can receive light is set to be not less than 225 degrees and not more than 315 degrees.

Next, a description will be given of the effects of the optical sensor 100 described above.

In the present embodiment, the positional relationship between the first light receiving elements 28 included in the same light receiving element set 32 and the corresponding first openings 30 has rotational symmetry of order 3 or more. Accordingly, when the optical sensor 100 is rotated about an axis along the Z-direction, there are three or more mounting angles $\beta$ at which the first light receiving elements 28 and the first openings 30 have the same positional relationship therebetween. In other words, when the optical sensor 100 is rotated about the axis along the Z-direction, there are three or more mounting angles $\beta$ at which detection characteristics are similar to each other. This can improve the placement flexibility of the optical sensor 100 without fixing the mounting angle $\beta$ to one angle.

A configuration can be considered in which the order of rotational symmetry of the positional relationship between the first light receiving elements 28 and the first openings 30 is only 2. However, in this configuration, incident light at the predetermined second angle $\phi$ may be less likely to be incident on the first light receiving element 28. On the other hand, a configuration can be considered in which the area of the planar shape of each of the first light receiving elements 28 is increased to increase the range of the second angle $\phi$ with respect to the first light receiving element 28. However, in this configuration, it is difficult for the optical sensor 100 to discriminate between incident light beams at the different second angles $\phi$, which may degrade detection accuracy with respect to the second angle $\phi$.

By contrast, in the present embodiment in which the order of rotational symmetry is 3 or more, it is possible to widen the range of the second angle $\phi$ in which the optical sensor 100 can detect incident light without increasing the area of the planar shape of each of the first light receiving elements 28. Accordingly, it is possible to suppress the degradation of the detection accuracy with respect to the second angle $\phi$, while widening the range of the second angle $\phi$ in which the optical sensor 100 can detect incident light.

In the present embodiment, the planar shapes of the individual first light receiving elements 28 are rotationally symmetric to each other about the Z-direction. This allows the individual first light receiving elements 28 to have closer detection characteristics. That is, it is possible to allow the optical sensor 100 mounted at the different mounting angles $\beta$ to have closer detection characteristics. This allows the optical sensor 100 to be easily mounted at the different mounting angles $\beta$ and can further improve the placement flexibility of the optical sensor 100.

As the incident light passing through each of the first openings 30 travels further away from the light blocking film 26 toward the substrate 22, the incident light is further away from the first opening 30 in the view projected in the Z-direction. Accordingly, the range in which the incident light passing through the first opening 30 at the predetermined first angle $\theta$ can be incident on the surface 22a has a circular shape in the view projected in Z-direction. In the view projected in the Z-direction, the center of the circular shape matches the center of the first opening.

By contrast, in the present embodiment, the first light receiving elements are formed to have fan-like planar shapes obtained by equally dividing a circle and equal shortest distances to the respective centers of the corresponding first openings 30. In other words, the first light receiving elements 28 have the planar shapes adapted to the full range in which incident light passing through the corresponding first openings 30 at the predetermined first angle $\theta$ can be incident.

This allows incident light at the second angle $\phi$ in the full range to be incident on the light receiving element set 32, while narrowing the range of the first angle $\theta$. As a result, it is possible to improve the detection accuracy of the optical sensor 100 with respect to the first angle $\theta$ and allow the optical sensor 100 to be mounted at all the mounting angles $\beta$. That is, it is possible to further improve the placement flexibility of the optical sensor 100, while improving the detection accuracy with respect to the first angle $\theta$.

Also, in the present embodiment, the positional relationship between the first light receiving elements 28 and the corresponding first openings 30 has rotational symmetry about the Z-direction, the order of which is an even number. This allows the optical sensor 100, when 180° rotated about the axis along the Z-direction and placed, to have close detection characteristics. Accordingly, it is easy for the optical sensor 100 to be 180° rotated from the predetermined mounting angle $\beta$ and placed.

Second Embodiment

In the present embodiment, a description of portions common to those of the optical sensor 100 shown in the first embodiment is omitted. Note that, in FIG. 5, the first light receiving elements 28 and a second light receiving element 34 are hatched to clearly show the respective planar shapes thereof.

Figure 5:
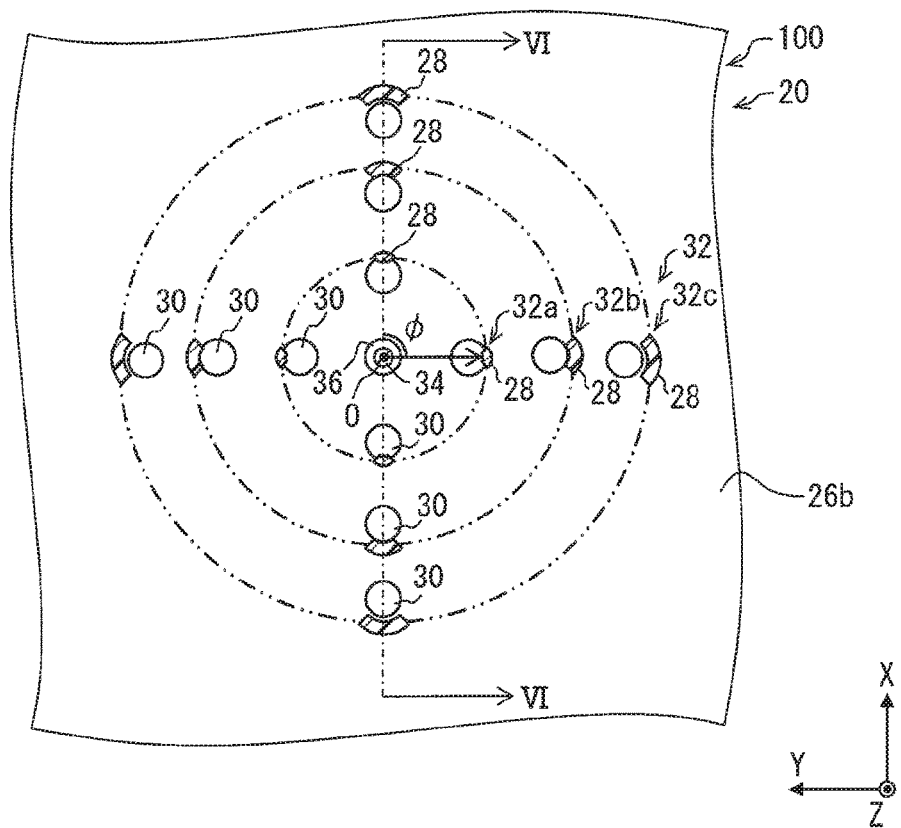
FIG. 5 is a plan view showing a detailed structure of the detection unit of an optical sensor according to a second embodiment, which corresponds to FIG. 3.
Figure 6:
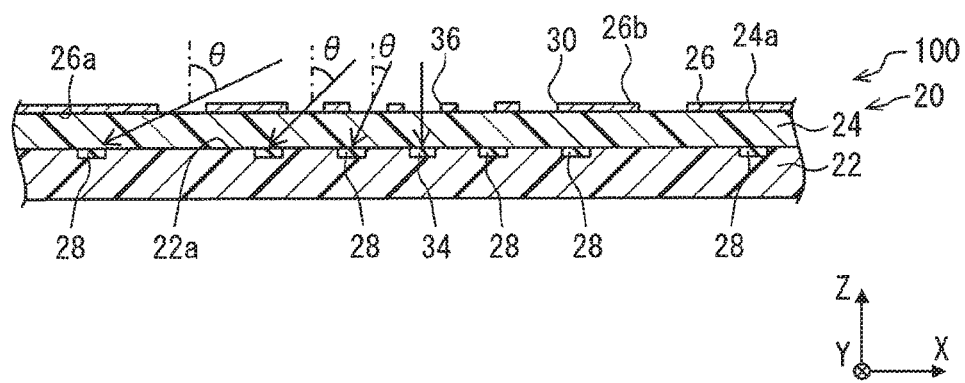
FIG. 6 is a cross-sectional view along a line VI-VI in FIG. 5.

As shown in FIGS. 5 and 6, the plurality of first light receiving elements 28 form a plurality of the light receiving element sets 32. The first angle θ with respect to the first light receiving elements 28 in one of the light receiving element sets 32 is different from the first angle θ with respect to the first light receiving elements 28 in another of the light receiving element sets 32. In the present embodiment, the plurality of first light receiving elements 28 form a first light receiving element set 32a, a second light receiving element set 32b, and a third light receiving element set 32c as the light receiving element sets 32.

The first angle θ with respect to the first light receiving elements 28 in the first light receiving element set 32a is set larger than the first angle θ with respect to the first light receiving elements 28 in the second light receiving element set 32b. Accordingly, in the view projected in the Z-direction, the distances between the first light receiving elements 28 and the first openings 30 are set shorter in the first light receiving element set 32a than in the second light receiving element set 32b. The first angle θ with respect to the first light receiving elements 28 in the second light receiving element set 32b is set larger than the first angle θ with respect to the first light receiving elements 28 in the third light receiving element set 32c. Accordingly, in the view projected in the Z-direction, the distances between the first light receiving elements 28 and the first openings 30 are set shorter in the second light receiving element set 32b than in the third light receiving element set 32c.

Each of the light receiving element sets 32 includes the four first light receiving elements 28. In each of the light receiving element sets 32, the positional relationship between the first light receiving elements 28 and the first openings 30 in the view projected in the Z-direction has rotational symmetry of order 4 about the Z-direction. In other words, the light blocking film 26 is formed such that, for each of the light receiving element sets 32, the direction of travel of incident light relative to the first light receiving elements 28 in the view projected in the Z-direction has rotational symmetry of order 4 about the Z-direction.

In the same manner as in the first embodiment, over the surface 22a, the plurality of first light receiving elements 28 are formed in a circular pattern in the form of an exact circle. The first light receiving elements 28 are formed in the circular patterns which are different from one light receiving element set 32 to another. The respective centers of the circular patterns of the individual light receiving element sets 32 substantially coincide with each other. The diameter of the circular pattern of the first light receiving element set 32a is set shorter than the diameter of the circular pattern of the second light receiving element set 32b. The diameter of the circular pattern of the second light receiving element set 32b is set shorter than the diameter of the circular pattern of the third light receiving element set 32c.

The detection unit 20 has the second light receiving element 34 on which incident light is incident at an angle different from the first angle θ with respect to each of the first light receiving elements 28. On the surface 22a of the substrate 22, the second light receiving element 34 is formed at a position different from the positions where the first light receiving elements 28 are formed. In the present embodiment, the first angle θ with respect to the second light receiving element 34 is set to 0 degrees. The second light receiving element 34 outputs a detection signal in accordance with the intensity of incident light, similarly to each of the first light receiving elements 28. In the present embodiment, the second light receiving element 34 is provided as a photodiode. The planar shape of the second light receiving element 34 is in the form of an exact circle.

The light blocking film 26 has a second opening 36 formed correspondingly to the second light receiving element 34. In the view projected in the Z-direction, the second opening 36 is formed at substantially the same position as that of the second light receiving element 34. The planar shape of the second light receiving element 34 is in the form of an exact circle. The second opening 36 is a through hole formed to extend from the surface 26a to the back surface 26b, similarly to each of the first openings 30.

In a configuration in which the optical sensor 100 is mounted on the front windshield 200 at different windshield angles α, even the same incident light is at different angles of incidence with respect to the optical sensor 100. Accordingly, in the optical sensor 100 designed such that the first light receiving elements 28 and the first openings 30 have a predetermined positional relationship therebetween, the windshield angle α at which the optical sensor 100 can be mounted is fixed.

By contrast, in the present embodiment, the plurality of first light receiving elements 28 form the plurality of light receiving element sets 32 with respect to which the first angles θ are different from each other. Accordingly, the optical sensor 100 can detect incident light at the plurality of first angles θ. In other words, even when the optical sensor 100 is mounted on the front windshield 200 at different windshield angles α, any of the light receiving element sets 32 readily receives incident light. This allows the optical sensor 100 to be easily mounted on the front windshield 200 at different windshield angles α and can improve the placement flexibility of the optical sensor 100.

In the present embodiment, the second light receiving element 34 on which incident light is incident at the first angle θ different from the first angle θ with respect to each of the first light receiving elements 28 is formed in the substrate 22. This can widen the range of the first angle θ in which the optical sensor 100 can detect incident light. This allows the optical sensor 100 to be easily mounted on the front windshield 200 at different windshield angles α and can improve the placement flexibility of the optical sensor 100.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

Figure 7:
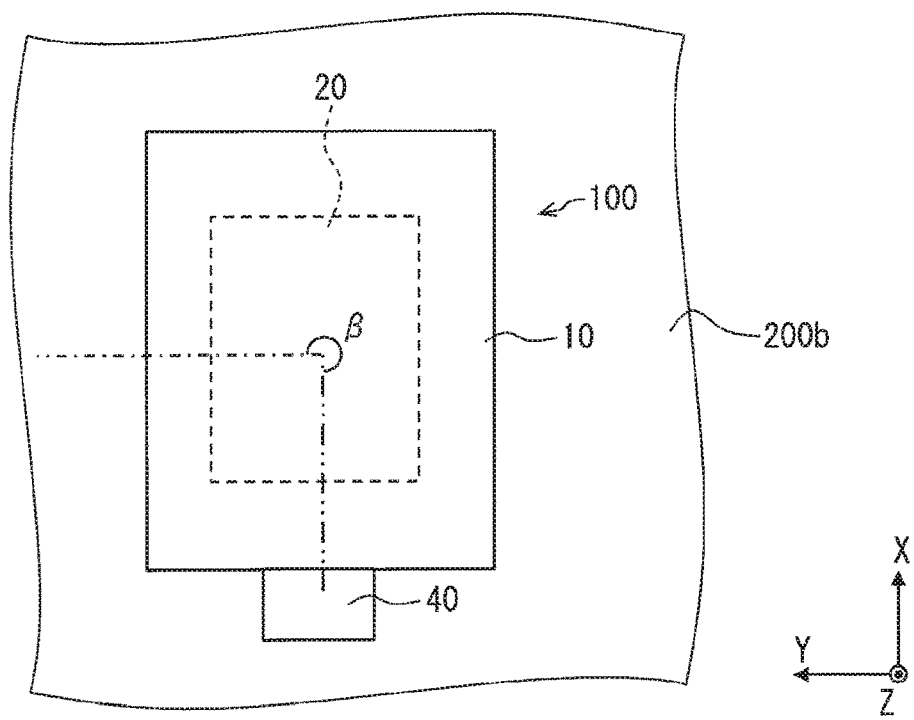
FIG. 7 is a plan view showing a schematic configuration of an optical sensor according to a first modification, which corresponds to FIG. 2.

In each of the above-described embodiments, the example is shown in which the mounting angle β is set to 90 degrees. However, the mounting angle β is not limited thereto. As shown in a first modification of FIG. 7, it is also possible to use an example in which the mounting angle β is set to 270 degrees. In the first modification, the optical sensor 100 is allowed to have detection characteristics similar to those of the optical sensor 100 in each of the above-described embodiments.

Figure 8:
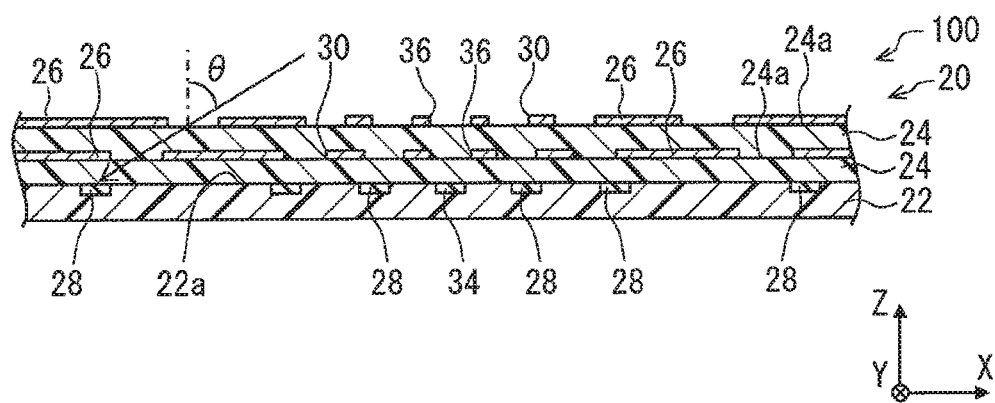
FIG. 8 is a cross-sectional view showing a detailed structure of the detection unit of an optical sensor according to a second modification, which corresponds to FIG. 4.

Also, in each of the above-described embodiments, the example using the one light blocking film 26 is shown. However, the light blocking film 26 is not limited thereto. As shown in a second modification of FIG. 8, an example in which the detection unit 20 has a plurality of the light blocking films 26 can also be used. In the second modification, the detection unit 20 has the two light transmission films 24 and the two light blocking films 26. The plurality of light transmission films 24 and the plurality of light blocking films 26 are alternately stacked. In the second modification, the second light receiving element 34 is formed in the substrate 22.

In one of the directions along the Z-direction extending from the detection unit 20 toward the front windshield 200, the substrate 22, the light transmission film 24, the light blocking film 26, the light transmission film 24, and the light blocking film 26 are stacked in this order. In each of the light blocking films 26, the first and second openings 30 and 36 are formed.

Each of the first openings 30 is formed such that the first angle $\theta$ is a predetermined angle with respect to the corresponding first light receiving element 28. Accordingly, in the view projected in the Z-direction, the first openings 30 of the individual light blocking films 26 which correspond to the same first light receiving element 28 are formed at different positions. The second opening 36 is formed such that the first angle $\theta$ is 0 degrees with respect to the corresponding second light receiving element 34. Consequently, in the view projected in the Z-direction, the second openings 36 of the individual light blocking films 26 corresponding to the same second light receiving element 34 are formed at the same position.

It may also be possible to use an example in which the detection unit 20 does not have the light transmission film 24. For example, only the light blocking film 26 is disposed over the surface 22a, and the direction of travel of incident light relative to each of the first light receiving elements 28 is defined by the first opening 30 of the light blocking film 26.

Figure 9:
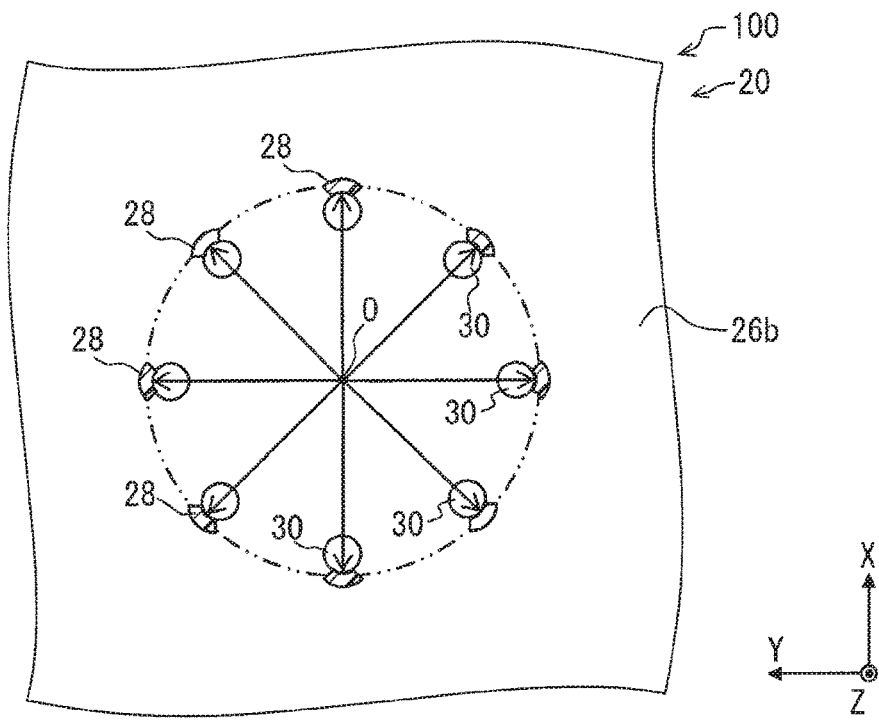
FIG. 9 is a plan view showing a detailed structure of the detection unit of an optical sensor according to a third modification, which corresponds to FIG. 3.
Figure 10:
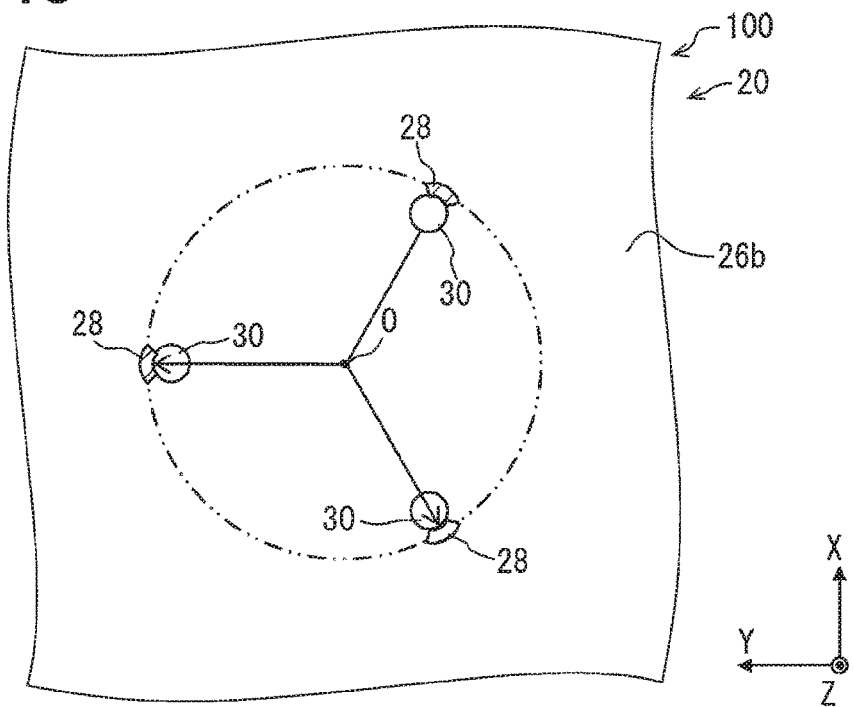
FIG. 10 is a plan view showing a detailed structure of the detection unit of an optical sensor according to a fourth modification, which corresponds to FIG. 3.

In each of the above-described embodiments, the example is shown in which the positional relationship between the first light receiving elements 28 and the first openings 30 has rotational symmetry of order 4 about the Z-direction. However, the positional relationship between the first light receiving elements 28 and the first openings 30 is not limited thereto. As shown in a third modification of FIG. 9, it may also be possible to use an example in which the positional relationship between the first light receiving elements 28 and the first openings 30 has rotational symmetry of order 8 about the Z-direction. Alternatively, as shown in a fourth modification of FIG. 10, it may also be possible to use an example in which the positional relationship between the first light receiving elements 28 and the first openings 30 has rotational symmetry of order 3 about the Z-direction.

Figure 11:
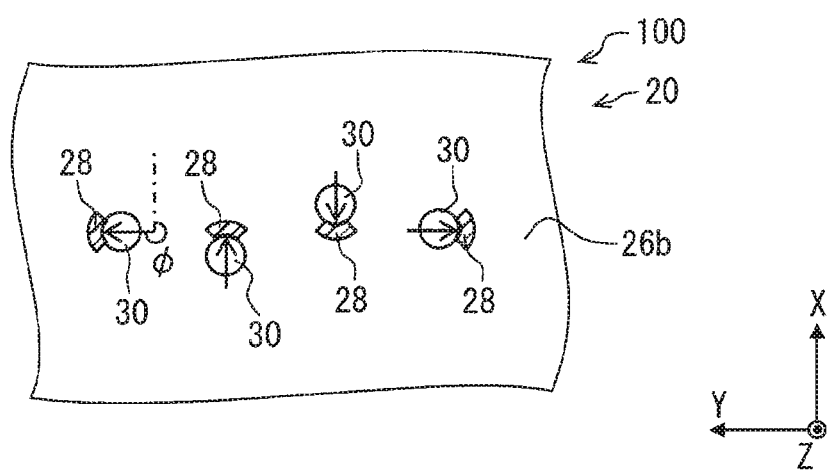
FIG. 11 is a cross-sectional view showing a detailed structure of the detection unit of an optical sensor according to a fifth modification, which corresponds to FIG. 3.

In each of the above-described embodiments, the example is shown in which the plurality of first light receiving elements 28 are formed to be arranged in the circular pattern. However, the arrangement of the first light receiving elements 28 is not limited thereto. The relative positions of the plurality of first light receiving elements 28 on the surface 22a are not limited. As shown in a fifth modification of FIG. 11, it may also be possible to use an example in which the plurality of first light receiving elements 28 are formed to be aligned in the Y-direction.

In the fifth modification, in the same manner as in the first embodiment, the four first light receiving elements 28 are formed in the substrate 22. The first light receiving elements 28 are formed such that the positional relationship between the individual first light receiving elements 28 and the corresponding first openings 30 has rotational symmetry of order 4 about the Z-direction. The rotational symmetry of the positional relationship between the first light receiving elements 28 and the first openings 30 is determined by the respective relative positions of the first light receiving elements 28 and the first openings 30 in projected view in the Z-direction, i.e., by the first angles $\theta$ and the second angles $\phi$.

In the fifth modification, the first angles $\theta$ with respect to the individual first light receiving elements 28 are equal to each other, and the values of the second angles $\phi$ are equidistant within the range of not less than 0 degrees and less than 360 degrees. Accordingly, the positional relationship between the first light receiving elements 28 and the first openings 30 has rotational symmetry about the Z-direction.

In each of the above-mentioned embodiments, the example is shown in which the planar shape of each of the first light receiving elements 28 is in the form of a fan. However, the planar shape of the first light receiving element 28 is not limited thereto. It is also possible to use an example in which the planar shape of each of the first light receiving elements 28 is in the form of, e.g., an exact circle or a rectangle. Also, in each of the above-mentioned embodiments, the example is shown in which the individual light receiving elements 28 have planar shapes which are rotationally symmetric to each other about the Z-direction. However, the two-dimensional shapes of the individual first light receiving elements 28 are not limited thereto.

The invention claimed is:

1. An optical sensor, comprising:
   a substrate having, in a surface thereof, a plurality of first light receiving elements each of which outputs a detection signal in accordance with an intensity of incident light; and
   a light blocking film disposed adjacent to the surface of the substrate and having a plurality of first openings corresponding to the first light receiving elements to define a direction of travel of the incident light relative to each of the first light receiving elements,
   wherein the plurality of first light receiving elements are provided such that the direction of travel of the incident light is different from a thickness direction of the substrate and form at least one light receiving element set in which an angle of incidence defined between the direction of travel of the incident light and the thickness direction is the same with respect to the light receiving elements,
   wherein, in a view projected in the thickness direction, a positional relationship between the first light receiving elements included in a same light receiving element set and the corresponding first openings has rotational symmetry of order 3 or more about an axis along the thickness direction,
   wherein, in the view projected in the thickness direction, the first light receiving elements included in the same light receiving element set have shapes which are rotationally symmetric to each other about the axis along the thickness direction, and
   wherein, in the view projected in the thickness direction, each of the first light receiving elements included in the same light receiving element set has a fan shape, the fan shape being obtained by equally dividing a circle into radial portions and inner peripheries of the radial portions are provided at equal shortest distances to a respective center of the corresponding first opening.

2. The optical sensor according to claim 1,
   wherein the plurality of first light receiving elements form a plurality of the light receiving element sets, and wherein the angle of incidence with respect to the light receiving elements in one of the light receiving element sets is different from the angle of incidence with respect to the light receiving elements in another of the light receiving element sets.

3. The optical sensor according to claim 1,
wherein, in the view projected in the thickness direction, the first light receiving elements included in the same light receiving element set and the corresponding first openings are provided such that the positional relationship therebetween has rotational symmetry about the thickness direction, the order of which is an even number.

4. The optical sensor according to claim 1,
wherein the substrate has a second light receiving element, which outputs a detection signal in accordance with the intensity of incident light, adjacent to the surface and at a position different from positions where the first light receiving elements are provided, and
wherein the light blocking film has a second opening which allows the incident light to be incident on the second light receiving element at an angle of incidence different from the angle of incidence with respect to each of the first light receiving elements.

5. The optical sensor according to claim 1, further comprising:
a plurality of the light blocking films,
wherein the plurality of light blocking films are stacked.

6. The optical sensor according to claim 1, wherein, in the view projected in the thickness direction, the fan shape is an annulus sector.

7. The optical sensor according to claim 6, wherein the first light receiving elements further have a planar shape.

* * * * *